United States Patent
Watanabe

(10) Patent No.: US 6,197,612 B1
(45) Date of Patent: Mar. 6, 2001

(54) SEMICONDUCTOR CHIP MOUNTING APPARATUS CAPABLE OF PREVENTING CONNECTED PORTION BETWEEN SEMICONDUCTOR CHIP AND SUBSTRATE FROM THERMAL STRESS AND METHOD THEREOF

(75) Inventor: Shinji Watanabe, Niigata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/177,376

(22) Filed: Oct. 23, 1998

(30) Foreign Application Priority Data

Oct. 23, 1997 (JP) .................................................. 9-291248

(51) Int. Cl.7 ............................. H01L 21/44; H01L 21/50
(52) U.S. Cl. .......................................... 438/106; 438/118
(58) Field of Search ...................................... 438/106, 118

(56) References Cited

U.S. PATENT DOCUMENTS

| | | | |
|---|---|---|---|
| 4,404,453 | * 9/1983 | Gotman | 219/121 |
| 4,480,975 | * 11/1984 | Plummer et al. | 425/116 |
| 4,941,255 | * 7/1990 | Bull | 437/218 |
| 4,971,196 | * 11/1990 | Kitamura et al. | 206/328 |
| 5,023,702 | * 6/1991 | Micic et al. | 357/74 |
| 5,090,609 | * 2/1992 | Nakao et al. | 228/123 |
| 5,237,205 | * 8/1993 | Newman | 257/783 |
| 5,667,129 | * 9/1997 | Morita et al. | 228/102 |
| 5,861,678 | * 1/1999 | Schrock | 257/782 |

FOREIGN PATENT DOCUMENTS

| | | |
|---|---|---|
| 63-237426 | 10/1988 | (JP) . |
| 2-14536 | 1/1990 | (JP) . |
| 5-326585 | 12/1993 | (JP) . |
| 7-7042 | 1/1996 | (JP) . |

* cited by examiner

Primary Examiner—Richard Elms
Assistant Examiner—Michael S. Lebentritt
(74) Attorney, Agent, or Firm—McGinn & Gibb, PLLC

(57) ABSTRACT

In a semiconductor chip mounting apparatus including a mounting section for mounting a semiconductor chip on a substrate, a loader which supplies the substrate to the mounting section, an unloader which contains the substrate having the semiconductor chip mounted thereon into a magazine, the substrate having the semiconductor chip is heated by a heater to be kept at high temperature after the mounting process and until a sealing process for sealing the substrate having the mounted semiconductor chip with a resin.

3 Claims, 3 Drawing Sheets

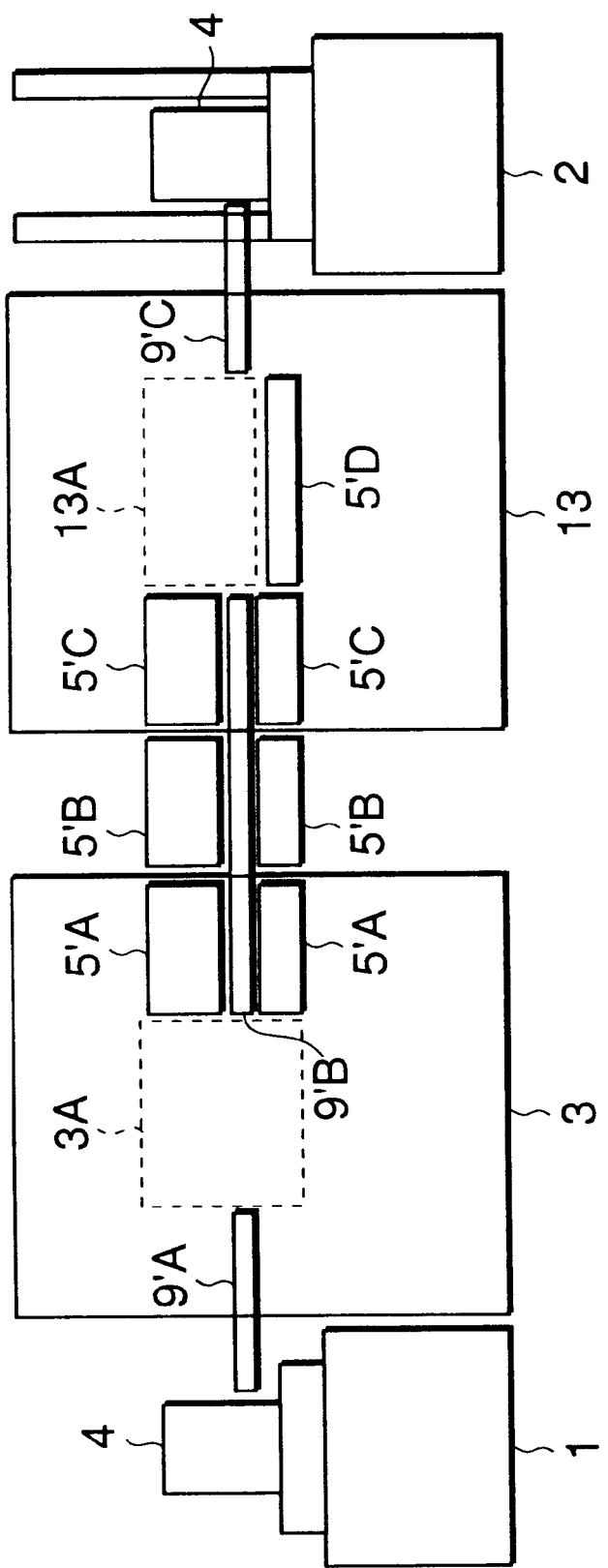

SEMICONDUCTOR CHIP MOUNTING APPARATUS CAPABLE OF PREVENTING CONNECTED PORTION BETWEEN SEMICONDUCTOR CHIP AND SUBSTRATE FROM THERMAL STRESS AND METHOD THEREOF

BACKGROUND OF THE INVENTION

This invention relates to a semiconductor chip mounting apparatus and a method of mounting a semiconductor chip, particularly to the semiconductor chip mounting apparatus and the method thereof for use in mounting a semiconductor chip on a substrate.

In mounting a semiconductor chip, such as a bear chip on a substrate, some mounting methods are generally used. In one of the mounting methods, for example, metal projections formed on electrodes of the bear chip are connected to electrodes of a substrate by solder, or the like. In another one of the mounting methods, gold projections are formed on electrodes of a bear chip so as to be thermally crimped to gold-plated electrodes of a substrate at a high temperature.

In the mounting methods, both the bear chip and the substrate are heated up to a high temperature during mounting process and thereafter naturally cooled down to an ordinary temperature. However, a great stress is imposed on a connected portion during the cooling process due to a difference between coefficient of thermal expansion of the bear chip and that of the substrate. When the substrate is made of an organic material such as glass epoxy resin, and the like, the difference of the coefficient of thermal expansion becomes serious. Accordingly, the great stress is imposed on the connected portion during the cooling process, since a shrinkage ratio of the substrate is larger than that of the bear chip. As a result, the connected portion is easily destroyed.

It is desired that the stress is reduced to obtain a reliable connected portion. Then, some proposals have been made to reduce the stress conventionally. A proposal is exemplified, as a first prior art, in unexamined Japanese Patent Publication No. Sho 63-237426, namely, 237426/1988. In the first prior art, it is attempted that a difference of amounts of thermal expansion between a semiconductor chip, such as a flip chip IC(Integrated Circuit) and a substrate is reduced by using expansion and shrinkage of resin at a comparatively low temperature for connecting the flip chip IC and the substrate. Thereby, the resin has already been fastened when the mounting process is finished to start a next cooling process. As a result, a thermal stress on a connected portion due to the difference of coefficient of thermal expansion is dispersed to prevent the connected portion from being destroyed.

However, as the connection is achieved only by a shrinkage of the resin, it becomes difficult to obtain reliability such as a temperature cycle resistant characteristic, or the like. In addition, boids are inevitably generated in the resin when the flip chip IC and the substrate are rapidly heated up to a high temperature. For preventing the boids from being generated, it therefore takes a long time to heat the flip chip IC and the substrate up to a high temperature. In view of a time to heat them up to a high temperature as well as a time to fasten the resin, the mounting method disclosed as the first prior art takes a time several times longer than the above-mentioned generally used mounting methods. As a result, a productivity per production facility unit is not so good in the first prior art.

On the other hand, another proposals are exemplified, as a second prior art, in unexamined Japanese Patent Publications No. Hei 2-14536, namely, 14536/1990, No. Hei 7-7042, namely, 7042/1995, or No. Hei 5-326585, namely, 326585/1993. In each second prior art, it is attempted that a difference of amounts of thermal expansion between a semiconductor chip and a substrate is reduced by a design of a structure of the semiconductor chip or a design of a structure of mounting the semiconductor chip on the substrate. However, members of the semiconductor chip and the substrate becomes very expensive in the second prior art. Furthermore, the second prior art cannot completely resolve the aforesaid problem of the thermal stress on the connected portion. Namely, the thermal stress is imposed, more or less on the connected portion, since a difference of amounts of thermal expansion between the semiconductor chip and the substrate cannot be substantially eliminated.

SUMMARY OF THE INVENTION

It is therefore an object of the present invention to provide a semiconductor chip mounting apparatus and a method of mounting a semiconductor chip by which a high productivity can be obtained and in which a thermal stress on a connected portion can be reduced to a desirable extent at a low cost.

It is another object of the present invention to provide a semiconductor chip mounting apparatus and a method of mounting a semiconductor chip of the type described which can be widely applied, for example, a semiconductor chip generally circulated in market for the purpose of connection by wire bonding or an inexpensive substrate made of a basic material of glass epoxy.

Other objects of this invention will become clear as the description proceeds.

According to an aspect of this invention, there is provided a semiconductor chip mounting apparatus for use in mounting a semiconductor chip on a substrate, comprising; mounting means for mounting the semiconductor chip on the substrate; a loader which supplies the substrate to the mounting means; an unloader which contains the substrate having the semiconductor chip mounted by the mounting means into a magazine, the magazine being set on the unloader; first heating means which is located between the mounting means and the unloader and which heat the substrate having the semiconductor chip to be kept at a predetermined temperature; and second heating means which is located on the unloader and which previously heat the magazine to be kept at the predetermined temperature before the substrate having the semiconductor chip is contained into the magazine.

The second heating means may surround the magazine on the unloader.

The semiconductor chip mounting apparatus may further comprise a temperature control system for controlling temperatures of the first and the second heating means, the temperatures of the first and the second heating means may be controlled by the temperature control system independently from each other.

The magazine may have a plurality of shelves each of which contains the substrate having the semiconductor chip, the unloader may have an elevator by which the magazine freely rise and fall so as to contain the substrate having the semiconductor chip into any one of the shelves.

The second heating means may be tall enough in height to heat a whole of the magazine even though the magazine is in the uppest or the lowest position available by the elevator.

The unloader may have a preliminary buffer, the magazine may be previously heated within the preliminary buffer.

The unloader may have a drain buffer, the magazine may be contained into the drain buffer to be kept at the predetermined temperature until the substrate having the semiconductor chip is sent to a next process.

According to another aspect of this invention, there is provided a semiconductor chip mounting apparatus for use in mounting a semiconductor chip on a substrate, comprising: mounting means for mounting the semiconductor chip on the substrate; a loader which supplies the substrate to the mounting means; resin sealing means for sealing a connection between the semiconductor chip and the substrate by a resin after the semiconductor chip is mounted on the substrate; an unloader which contains the substrate having the semiconductor chip sealed by the resin sealing means; and heating means which is located between the mounting means and the resin sealing means, both inclusive, and which heat the substrate having the semiconductor chip to be kept at a predetermined temperature until the connection is sealed by the resin.

According to still another aspect of this invention, there is provided a method of mounting a semiconductor chip on a substrate, the semiconductor chip and the substrate being prepared in a known manner, the method comprising the steps of: supplying the substrate; mounting the semiconductor chip on the substrate; containing the substrate having the semiconductor chip mounted thereon into a magazine; sealing the substrate having the semiconductor chip mounted thereon by a resin; and heating the substrate having the semiconductor chip mounted thereon to a predetermined temperature after the mounting step until the sealing step.

The magazine may be previously heated to make the substrate having the semiconductor chip reach the predetermined temperature on the heating step.

The heating step may further comprise the steps of: firstly heating the substrate having the semiconductor chip mounted thereon to a predetermined temperature after the mounting step until the containing step; and secondly heating the substrate having the semiconductor chip contained in the magazine during the containing step.

BRIEF DESCRIPTION OF THE DRAWINGS

FIG. 4 is a schematic side view for showing a structure of a semiconductor chip mounting apparatus and a method of mounting a semiconductor chip according to a second embodiment of the present invention.

DESCRIPTION OF THE PREFERRED EMBODIMENTS

Figure 1:
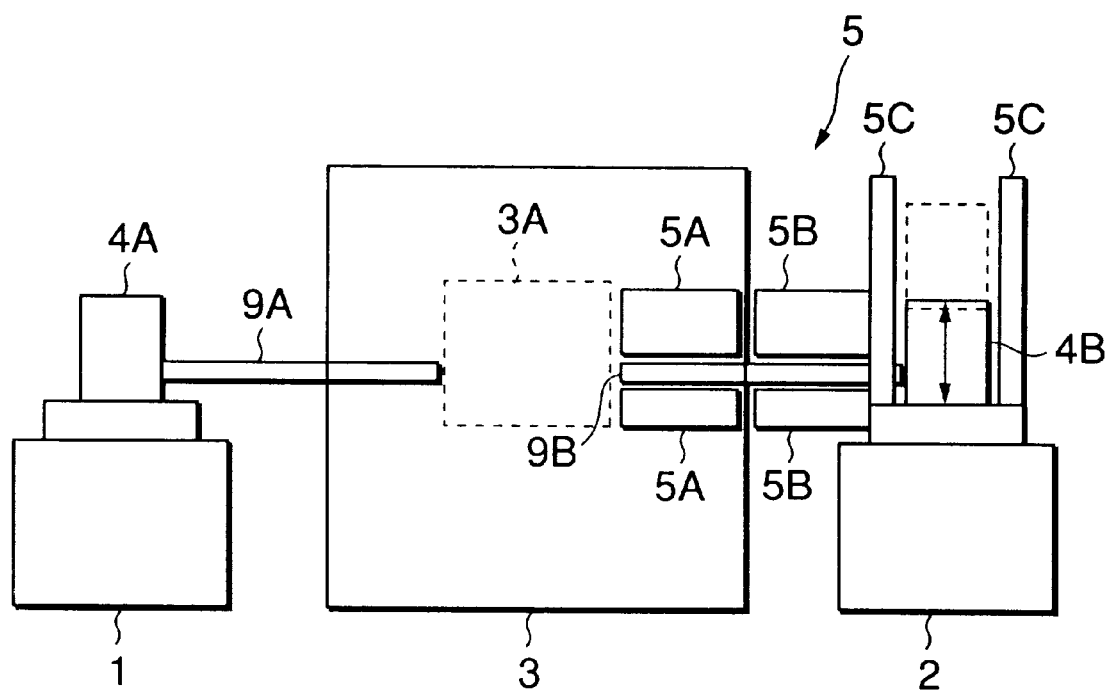
FIG. 1 is a schematic side view for showing a structure of a semiconductor chip mounting apparatus and a method of mounting a semiconductor chip according to a first embodiment of the present invention.
Figure 2:
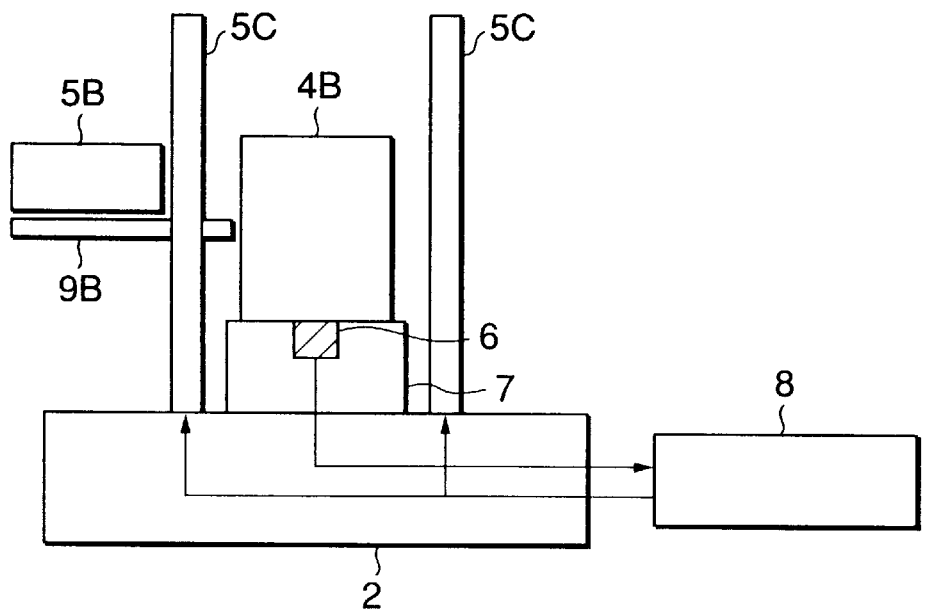
FIG. 2 is a schematic side view for showing a structure of an unloader and a heating portion of the semiconductor chip mounting apparatus illustrated in FIG. 1.
Figure 3:
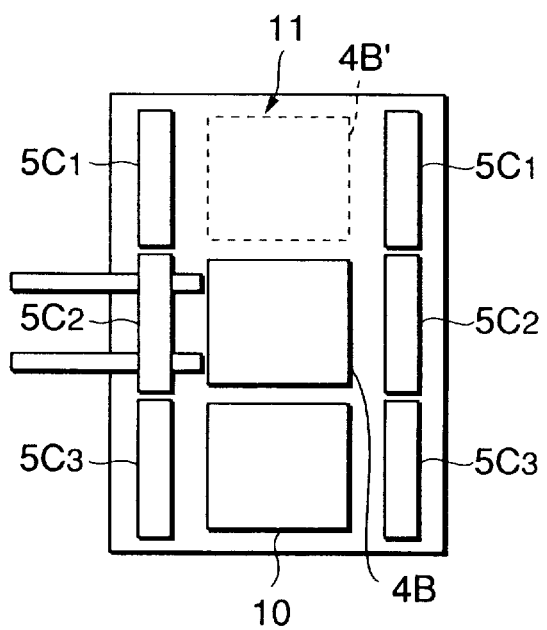
FIG. 3 is a schematic plan view for showing a structure of an unloader and a heating portion of the semiconductor chip mounting apparatus illustrated in FIG. 1.

Referring to FIGS. 1 through 3, description will proceed to a semiconductor chip mounting apparatus and a method of mounting a semiconductor chip according to a first embodiment of the present invention. FIG. 1 is a schematic side view of the semiconductor chip mounting apparatus according to the first embodiment. FIG. 2 is a schematic side view of unloader and heating sections of the semiconductor chip mounting apparatus. FIG. 3 is a schematic plan view of the unloader and the heating portion of the semiconductor chip mounting apparatus, As illustrated in FIG. 1, the semiconductor chip mounting apparatus comprises a flip chip mounting section 3, a loader 1 located in a forward direction (herein, the forward direction is directed left hand side of the sheet of FIG. 1) of the flip chip mounting section 3, an unloader 2 located in a backward direction (herein, the backward direction is directed right hand side of the sheet of FIG. 1) of the flip chip mounting section 3, and a heater 5 located over the flip chip mounting section 3 and the unloader 2.

As depicted in FIG. 1, the flip chip mounting section 3 includes a mounting area 3A. A first magazine 4A is set on the loader 1 while a second magazine 4B is set on the unloader 2. The first magazine 4A has a plurality of shelves (not shown) each of which contains a substrate. The second magazine 4B has a plurality of shelves (not shown) each of which contains the substrate having a semiconductor chip mounted thereon. The heater 5 includes heating portions 5A, 5B and 5C. The heating portion 5A is positioned next to the mounting area 3A in the flip chip mounting section 3. The heating portion 5B is positioned between the flip chip mounting section 3 and the unloader 2. The heating portion 5C is positioned in the unloader 2 to extend a perpendicular direction. Besides, the semiconductor chip mounting apparatus further comprises substrate conveyers 9A and 9B. The substrate conveyer 9A is extended from the loader 1 to the mounting area 3A while the substrate conveyer 9B is extended from the mounting area 3A to the unloader 2. The heating portion 5A consists of a couple of parts placed in upper and lower sides of the substrate conveyer 9B, respectively. Similarly, the heating portion 5B consists of a couple of parts placed in upper and lower sides of the substrate conveyer 9B, respectively.

Now, referring to FIGS. 2 and 3, description is made as regards details of the unloader 2 and the heating portion 5C. FIG. 2 is a schematic side view of the unloader 2 and the heating portion 5C. FIG. 8 is a schematic plan view of the unloader 2 and a heating portion 5C of the heater 5.

As illustrated in FIG. 2, the semiconductor chip mounting apparatus further comprises a temperature measurement sensor 6, an elevator 7 and a temperature controller 8. The temperature measurement sensor 6 is electrically connected to the temperature controller 8. The temperature controller 8 is electrically connected to the heating portion 5C. As illustrated rather in FIG. 1, the second magazine 4B can freely rise and fall by the elevator 7.

As illustrated in FIG. 3, the semiconductor chip mounting apparatus further comprises a drain buffer 10 and a preliminary buffer 11. After containing all the substrate each having the bear chip thereon, the second magazine 4B is moved to the drain buffer 10 to be stored for the time being. The second magazine 4B is thereafter moved to a next process, namely a resin sealing process. A next (second) magazine 4B is set in the preliminary buffer 11 to be previously heated by the heating portion 5C. As illustrated in FIG. 3, the heating portion 5C is separated into heating portions 5C1, 5C2, and 5C3. The heating portion 5C1 consists of a couple of parts placed in forward and backward sides of the preliminary buffer 11, respectively. Similarly, the heating portion 5C2 consists of a couple of parts placed in forward and backward sides of a set position of the second magazine 4B, respectively. Similarly, the heating portion 5C3 consists of a couple of parts placed in forward and backward sides of the drain buffer 10. Thus, temperatures of the heating portions 5C1, 5C2, and 5C3 are controlled by the temperature controller 8 independently from each other.

Referring to FIGS. 1, 2 and 3 continued, description proceeds to an operation of the semiconductor chip mounting apparatus and a method of mounting the semiconductor chip according to the first embodiment of the present invention.

The loader 1 supplies a substrate (not shown) from the first magazine 4A to the mounting area 3A of the flip chip mounting section 3 through the substrate conveyer 9A. In the mounting area 3A, a bear chip (not shown) is mounted on the substrate supplied from the loader 1. On the other hand, the second magazine 4B is previously set on the unloader 2 to be kept at a high temperature condition by the heating portion 5C2 of the heater 5. After mounting the bear chip on the substrate, the substrate having the bear chip mounted thereon is kept at a temperature not lower than a predetermined temperature by the heating portions 5A and 5B located over the inner and the outer sides of the flip chip mounting section 3 to be contained in each shelf of the second magazine 4B on the unloader 2. The contained substrate is then kept at a high temperature together with the second magazine 4B. When the substrates which were contained in the first magazine 4A are all contained into the second magazine 4B with respective boar chips mounted thereon, the second magazine 4B is then contained into the drain buffer 10.

As illustrated in FIGS. 1 and 2, the second magazine 4B can freely rise and fall by the elevator 7, so that the second magazine 4B can contain the substrate having the mounted bear chip into any one of its shelves. As clearly shown in FIG. 2, the heating portion 5C is large (tall) enough in size (height) to heat a whole of the second magazine 4B' even if the second magazine 4B is in the uppest or the lowest position available by the elevator 7. A temperature of the second magazine 4B is detected by the temperature measurement sensor 6. A detected data of the temperature is produced from the temperature measurement sensor 6 to be input into the temperature controller 8. The temperature controller 8 controls the heater 5, especially the heating portion 5C so as to keep the second magazine 4B at a desirable temperature.

As illustrated in FIG. 3, a next (second) magazine 4B can be set in the preliminary buffer 11 to be previously heated by the heating portion 5C1 of the heater 5. It therefore becomes unnecessary to take a time to heat a next (second) magazine 4B' up to the desirable temperature, even when the next (second) magazine 4B is newly set on the unloader 2 in spite of the second magazine 4B contained into the drain buffer 10. The second magazine 4B contained into the drain buffer 10 is heated by the heating portion 5C3 of the heater 5 to be also kept at the high temperature condition. As a result, the second magazine 4B is sent to a next process, namely a resin sealing process, with being kept at the high temperature condition. It then becomes possible that the resin is sealed and hardened at such a high temperature condition. Consequently, the sealed resin has already been hardened, when the substrate and the bear chip mounted thereon are cooled to shrink in a process after the resin sealing process. Accordingly, it is possible to prevent the connected portion from concentration of the stress. In a case that the substrate and the bear chip mounted thereon are cooled down to an ordinary temperature, all the substrates having the mounted bear chips can be slowly cooled with being contained in the second magazine 4B by controlling the heating portion 5C3 for heating the drain buffer 10. Thus, it is possible to reduce a thermal impact on the connected portion caused by a quench to a minimum extent, after the bear chip is mounted on the substrate.

Referring now to FIG. 4, description will proceed to a semiconductor chip mounting apparatus and a method of mounting a semiconductor chip according to a second embodiment of the present invention. FIG. 4 is a schematic side view of the semiconductor chip mounting apparatus according to the second embodiment.

As illustrated in FIG. 4, the semiconductor chip mounting apparatus comprises a flip chip mounting section 3, a loader 1 located in a forward direction (herein, the forward direction is directed left hand side of the sheet of FIG. 4) of the flip chip mounting section 3, a resin sealing section 13, an unloader 2 located in a backward direction (herein, the backward direction is directed right hand side of the sheet of FIG. 4) of the resin sealing section 13, and a heater 5' located over the flip chip mounting section 3 and the resin sealing section 13. The heater 5' includes heating portions 5'A, 5'B, 5'C and 5'D. The heating portion 5'A is positioned next to the mounting area 3A in the flip chip mounting section 3. The heating portion 5'B is positioned between the flip chip mounting section 3 and the resin sealing section 13. The heating portion 5'C is positioned in the resin sealing section 13 in a backward position of a resin applying and hardening area 13A. The heating portion 5'D is positioned in the resin sealing section 13 in a lower position of the resin applying and hardening area 13A. Besides, the semiconductor chip mounting apparatus further comprises substrate conveyers 9'A, 9'B and 9'C. The substrate conveyer 9'A is extended from the loader 1 to the mounting area 3A. The substrate conveyer 9'B is extended from the mounting area 3A to the resin applying and hardening area 13A. The substrate conveyer 9'C is extended from the resin applying and hardening area 13A to the unloader 2. The heating portion 5'A consists of a couple of parts placed in upper and lower sides of the substrate conveyer 9'B, respectively. Similarly, the heating portion 5'B consists of a couple of parts placed in upper and lower sides of the substrate conveyer 9'B, respectively. Similarly, the heating portion 5 'C consists of a couple of parts placed in upper and lower sides of the substrate conveyer 9'B, respectively. On the contrary, the heating portion 5'D consists of a single part placed in a lower side of the resin applying and hardening area 13A.

As will be understood from FIG. 4, the resin sealing section 13 is coupled to the flip chip mounting section 3 in the second embodiment. The substrate having the bear chip mounted thereon is heated by the heating portions 5'A, 5'B and 5'C while the substrate is sent from the flip chip mounting section 3 to the resin sealing section 13 through the conveyer portions 9'B. Furthermore, the substrate having the bear chip mounted thereon is also heated by the heating portion 5'D in the resin applying and hardening area 13A during the resin sealing process. As a result, the resin sealing can be carried out on a condition that the substrate having the bear chip mounted thereon is kept at a temperature not lower than a predetermined temperature.

As described above, the first and the second embodiments can be applied to a flip chip mounting method with high productivity in which the bear chip is mounted on the substrate and then sealed by resin. In the first and the second embodiments, the temperature control system is added to the flip chip mounting method with high productivity, for controlling the temperature of the substrate after the bear chip is mounted. It becomes possible that the resin sealing is carried out with the substrate having the bear chip mounted thereon being kept at a high temperature. It also becomes possible that an impact caused by shrinkage due to a cooling speed for cooling the substrate after mounting the bear chip thereon is decreased to a minimum extent.

While the present invention has thus far been described in conjunction with only two embodiments thereof, it will now be readily possible for one skilled in the art to put the present invention into effect in various other manners. For example, the bear chip is mounted on the substrate in the above-mentioned first and the second embodiments. However, a semiconductor chip mounted on the substrate is not restricted to the bear chip. Any other semiconductor chips can be used to be mounted on the substrate in the present invention.

What is claimed is:

1. A method of mounting a semiconductor chip on a substrate, said semiconductor chip and said substrate being prepared in a known manner, said method comprising the steps of:

supplying said substrate;

mounting said semiconductor chip on said substrate;

containing said substrate having said semiconductor chip mounted thereon into a magazine;

sealing said substrate having said semiconductor chip mounted thereon by a resin; and heating said substrate having said semiconductor chip mounted thereon to a predetermined temperature after said mounting step until said sealing step.

2. A method as claimed in claim 1, wherein said magazine is previously heated to make said substrate having said semiconductor chip reach the predetermined temperature on said heating step.

3. A method as claimed in claim 1, wherein said heating step further comprising the steps of:

firstly heating said substrate having said semiconductor chip mounted thereon to a predetermined temperature after said mounting step until said containing step; and secondly heating said substrate having said semiconductor chip contained in said magazine during said containing step.

* * * * *